(12) United States Patent
Takai (10) Patent No.: US 8,643,366 B2
(45) Date of Patent: Feb. 4, 2014

(54) MAGNETIC RESONANCE IMAGING APPARATUS AND MAGNETIC RESONANCE IMAGING METHOD

(75) Inventor: Hiroshi Takai, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

(*) Notice: Subject to any disclaimer, the term of this patent is extended or adjusted under 35 U.S.C. 154(b) by 340 days.

(21) Appl. No.: 13/233,217

(22) Filed: Sep. 15, 2011

(65) Prior Publication Data
US 2012/0081116 A1 Apr. 5, 2012

(30) Foreign Application Priority Data
Sep. 30, 2010 (JP) ................................. 2010-223205
Aug. 29, 2011 (JP) ................................. 2011-186647

(51) Int. Cl.
*G01V 3/00* (2006.01)

(52) U.S. Cl.
USPC .......................................... 324/314; 324/318

(58) Field of Classification Search
USPC ............................ 324/300–322; 600/407–445
See application file for complete search history.

(56) References Cited

U.S. PATENT DOCUMENTS

| 4,678,996 A  * | 7/1987 | Haacke et al. ................ 324/309 |
| 7,945,305 B2 * | 5/2011 | Aggarwal et al. ............. 600/413 |
| 8,159,222 B2 * | 4/2012 | King et al. .................... 324/309 |
| 2011/0098552 A1 | 4/2011 | Takai |
| 2012/0313641 A1* | 12/2012 | Labadie et al. ............... 324/309 |

OTHER PUBLICATIONS

Haacke et al., "A Fast, Iterative, Partial-Fourier Technique Capable of Local Phase Recovery", *Journal of Magnetic Resonance*, vol. 92, 1991, pp. 126-145.

* cited by examiner

*Primary Examiner* — Brij Shrivastav
(74) *Attorney, Agent, or Firm* — Nixon & Vanderhye PC (57) ABSTRACT

According to one embodiment, a MRI apparatus includes a data acquisition unit, a phase correction amount calculation unit and an image data generating unit. The data acquisition unit acquires MR signals in 3D k-space according to an imaging condition for HFI. The phase correction amount calculation unit calculates a first phase correction amount by applying processing including a phase correction based on k-space data for calculating the first phase correction amount and data compensation for a non-sampling region with the MR signals in the 3D k-space. The k-space data for calculating the first phase correction are MR signals less than the MR signals in the 3D k-space. The image data generating unit generates MR image data by applying processing including a phase correction using a second phase correction amount based on the first phase correction amount and the data compensation with the MR signals in the 3D k-space.

7 Claims, 7 Drawing Sheets

(A) HOMODYNE FILTER (B) K-SPACE DATA AFTER
HOMODYNE FILTER

FIG. 4

(A) LOW PASS FILTER (B) K-SPACE DATA AFTER LOW PASS FILTER

MAGNETIC RESONANCE IMAGING APPARATUS AND MAGNETIC RESONANCE IMAGING METHOD

CROSS REFERENCES TO RELATED APPLICATIONS

This application is based upon and claims the benefit of priorities from Japanese Patent Application No. 2010-223205 filed on Sep. 30, 2010 and Japanese Patent Application No. 2011-186647 filed on Aug. 29, 2011; the entire contents of Japanese Patent Application No. 2010-223205 and Japanese Patent Application. No. 2011-186647 are incorporated herein by reference.

FIELD

Embodiments described herein relate generally to a magnetic resonance imaging apparatus and a magnetic resonance imaging method.

BACKGROUND

MRI is an imaging method which excites nuclear spin of an object set in a static magnetic field with a RF (radio frequency) signal having the Larmor frequency magnetically and reconstruct an image based on NMR (nuclear magnetic resonance) signals generated due to the excitation.

In the field of MRI, HFI (half Fourier imaging) method is known. The HFI method is an imaging method with compensating data in a region in which no data is acquired based on acquired k-space data by taking advantage of the complex symmetric of data in k-space.

As the conventional data processing for the HFI, HFI processing is performed. The HFI processing compensates data, which has not been acquired in k-space, based on acquired k-space data. Consequently, the whole data in k-space is generated.

Specifically, the HFI processing is performed in the following procedure. Here, it is assumed that the non-sampling region of k-space data is a high frequency region in the kz direction in k-space.

Firstly, two kinds of filter processing under a homodyne filter fh and a LPF (low pass filter) fl are performed in the kz direction in k-space. The homodyne filter fh is a filter which performs filter processing equivalent to processing for filling the non-sampling region with complex conjugate data. Specifically, the homodyne filter fh and the low pass filter fl are respectively performed on k-space data K to generate respective pieces of k-space data Kh(kx, ky, kz), Kl(kx, ky, kz) after the filter processing as shown by equations (1-1) and (1-2).

$$K(kx,ky,kz)fh \rightarrow Kh(kx,ky,kz) \quad (1\text{-}1)$$

$$K(kx,ky,kz)fl \rightarrow Kl(kx,ky,kz) \quad (1\text{-}2)$$

Next, 3D (three dimensional) FFT (Fast Fourier Transform) is performed to transform the respective pieces of the k-space data Kh(kx, ky, kz), Kl(Kx, ky, kz) into pieces of r-space data. Specifically, 3D FFT is performed on the pieces of the k-space data Kh(kx, ky, kz), Kl(kx, ky, kz) after the filter processing respectively to generate pieces of r-space data Vh(x, y, z), Vl(x, y, z) as shown by equations (2-1) and (2-2).

$$FFT\{Kh(kx,ky,kz)\} \rightarrow Vh(x,y,z) \quad (2\text{-}1)$$

$$FFT\{Kl(kx,ky,kz)\} \rightarrow Vl(x,y,z) \quad (2\text{-}2)$$

Next, phase correction processing and realization processing for removing errors are applied to the r-space data Vh after the homodyne filter processing fh. Specifically, the phase correction processing and the realization processing are performed to generate r-space data V(x, y, z) after the phase correction as shown by equation (3).

$$V(x,y,z)=REAL\{Vh(x,y,z)Vl^*(x,y,z)/|Vl(x,y,z)|\} \quad (3)$$

wherein Vl* denotes the complex conjugation of Vl and REAL( ) is the function to obtain the real part. Further, a weighted addition of the k-space data IFFT{V(x, y, z)} derived by 3D IFFT (Inverse Fast Fourier Transform) of the r-space data V(x, y, z) and the original k-space data K(kx, ky, kz) is performed with a weight coefficient α as shown by equation (4)

$$K(kx,ky,kz)=\alpha IFFT\{V(x,y,z)\}(1-\alpha)K(kx,ky,kz) \quad (4)$$

Then, the result of the weighted addition is used as the k-space data K(kx, ky, kz) for calculating the r-space data V(x, y, z) again, and the HFI processing shown by equations (1-1), (1-2), (2-1), (2-2), (3) and (4) is repeated about 1 to 4 times in order to improve accuracy in compensating processing of k-space. That is, the filter processing, the 3D FFT, the phase correction processing and the weighted addition processing are repeated.

However, three dimensional HFI requires acquiring a larger amount of data compared to two dimensional. HFI, which leads to increase a period necessary for reconstruction. Improving accuracy in compensating processing of k-space requires repeating the HFI processing. Therefore, the period for the reconstruction becomes long by the number of repetitions of the HFI processing, which leads to increase a period of data processing.

An object of embodiments according to the present invention is to reduce a data processing period in three dimensional HFI.

DETAILED DESCRIPTION

In general, according to one embodiment, a magnetic resonance imaging apparatus includes a data acquisition unit, a phase correction amount calculation unit and an image data generating unit. The data acquisition unit is configured to acquire magnetic resonance signals in three dimensional k-space according to an imaging condition for half Fourier imaging. The phase correction amount calculation unit is Configured to calculate a first phase correction amount by applying processing including a phase correction based on k-space data for calculating the first phase correction amount and data compensation for a non-sampling region using complex conjugate symmetry in k-space with the magnetic resonance signals in the three dimensional k-space. The k-space data for calculating the first phase correction are magnetic resonance signals less than the magnetic resonance signals in the three dimensional k-space. The image data generating unit is configured to generate magnetic resonance image data by applying processing including a phase correction using a second phase correction amount based on the first phase correction amount, the data compensation and image reconstruction processing with the magnetic resonance signals in the three dimensional k-space.

In addition, a magnetic resonance imaging method according to an embodiment of the present invention includes acquiring magnetic resonance signals in three dimensional k-space according to an imaging condition for half Fourier imaging; calculating a first phase correction amount by applying processing including a phase correction based on k-space data for calculating the first phase correction amount and data compensation for a non-sampling region using complex conjugate symmetry in k-space with the magnetic resonance signals in the three dimensional k-space; and generating magnetic resonance image data by applying processing including a phase correction using a second phase correction amount based on the first phase correction amount, the data compensation and image reconstruction processing with the magnetic resonance signals in the three dimensional k-space. The k-space data for calculating the first phase correction are magnetic resonance signals less than the magnetic resonance signals in the three dimensional k-space.

Figure 1:
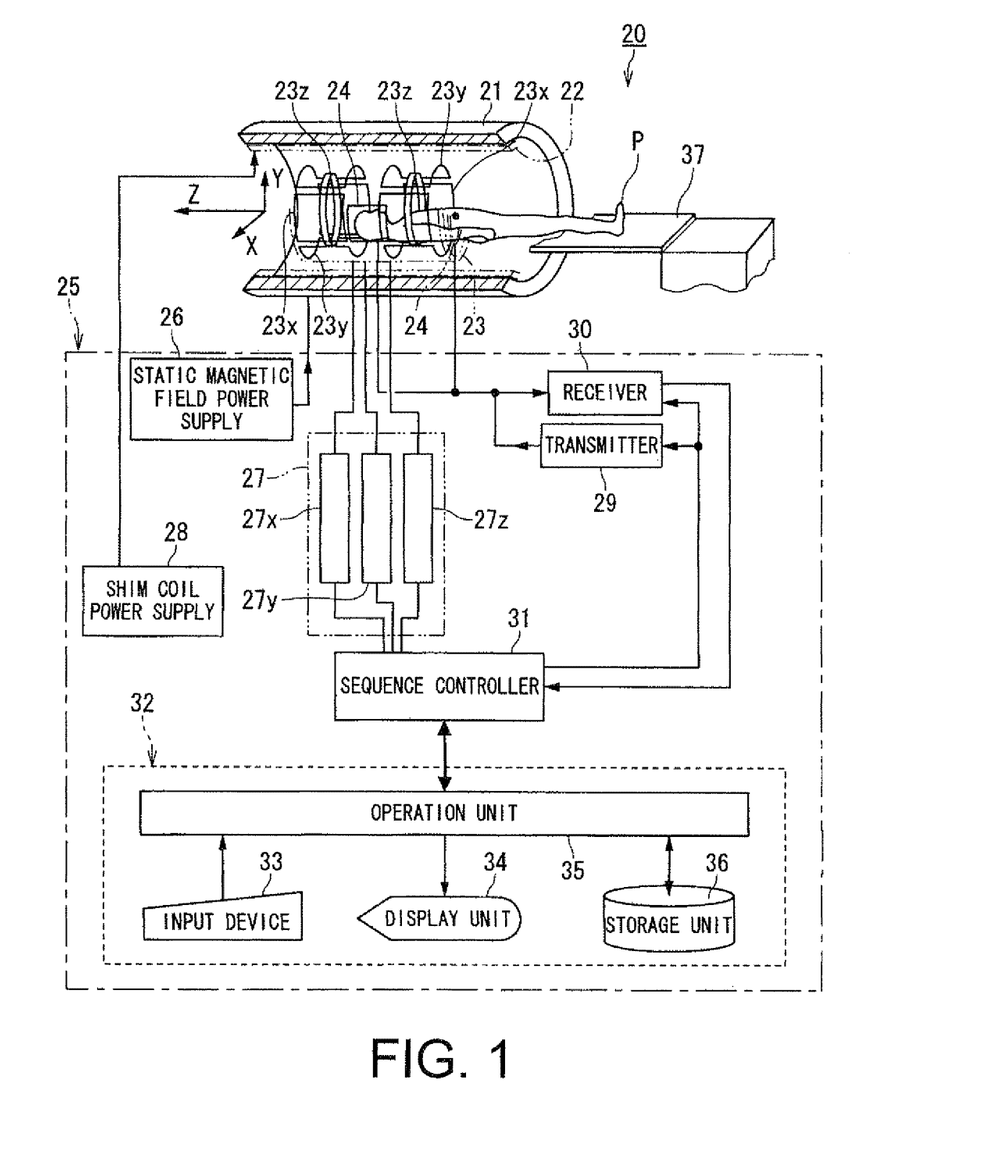
FIG. 1 is a block diagram showing a magnetic resonance imaging apparatus according to an embodiment of the present invention.

A magnetic resonance imaging apparatus and a magnetic resonance imaging Method according to embodiments of the present invention will be described with reference to the accompanying drawings. FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC: whole body coil), which is built in the gantry, for transmission and reception of RF signals and local coils, which are arranged around the bed 37 or the object F for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 transmits a RF signal given from the transmitter 29 to the object P. The reception RF coil 24 receives a MR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27

The sequence controller 31 is also configured to give raw data to the computer 32. The raw data is complex data obtained through the detection of a NMR signal and A/D (analog to digital) conversion to the NMR signal detected in the receiver 30.

The transmitter 29 gives RF signals to the RF coil 24 in accordance with control information provided from the sequence controller 31. The receiver 30 generates raw data which is digitized complex number data by detecting MR signals given from the RF coil 24 and performing signal processing and A/D converting to the detected MR signals. The receiver 30 also gives the generated raw data to the sequence controller 31. When the RF coil 24 includes plural coil elements, MR signals outputted from the respective coil elements may be inputted into reception channels respectively for signal processing. Alternatively, MR signals outputted from two and above coil elements out of the coil elements may be combined mutually to be inputted into a common reception channel for signal processing.

The computer 32 gets various functions by the operation unit 35 executing some programs stored in the storage unit 36 of the computer 32. Alternatively, some circuits having various functions may be provided with the magnetic resonance imaging apparatus 20 instead of using some of the programs.

Figure 2:
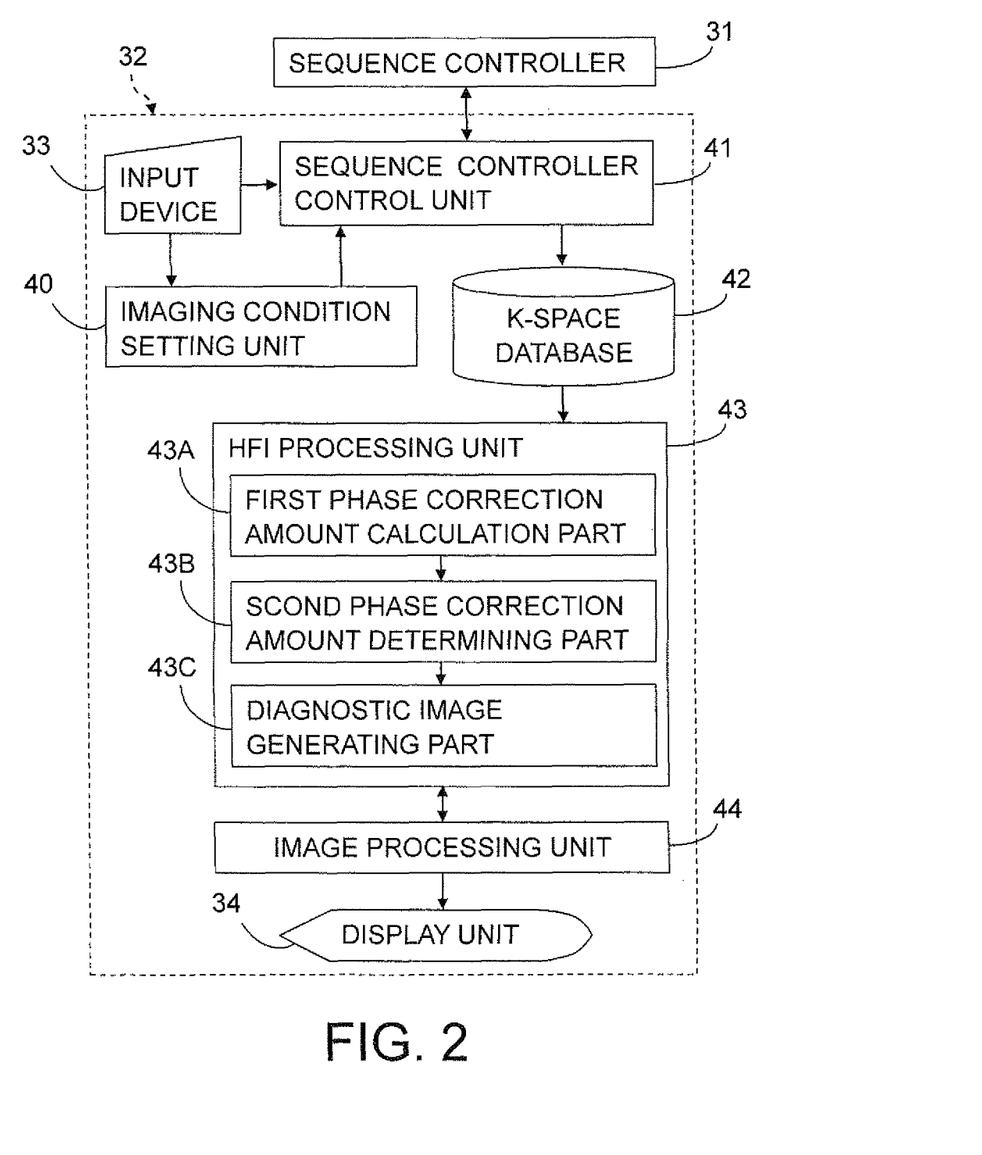
FIG. 2 is a functional block diagram of the computer shown in FIG. 1.

FIG. 2 is a functional block diagram of the computer 32 shown in FIG. 1.

The computer 32 functions as an imaging condition setting unit 40, a sequence controller control unit 41, a k-space database 42, a HFI processing unit 43 and an image processing unit 44 by the operation unit 35 executing the program.

The imaging condition setting unit 40 sets imaging conditions for 3D HFI based on instruction from the input device 33 and gives the set imaging conditions to the sequence controller control unit 41. The 3D HFI method is a method for acquiring MR data asymmetrically in a PE (phase encode) direction or a SE (slice encode) direction in 3D k-space and obtaining images by compensating k-space data in a non-sampling region, in which MR data is not acquired, based on acquired MR data (i.e., k-space data in the sampling region) using complex conjugate symmetry of data in k-space. Therefore, imaging conditions for 3D data acquisition are set for the 3D HFI method so that MR data corresponding to a high frequency region of the positive or negative side in a PE direction or a SE direction is not acquired. Note that, pulse sequences for HFI include a EASE (fast asymmetric spin echo or fast advanced spin echo) sequence or the like.

The sequence controller control unit 41 controls and drives the sequence controller 31 by outputting imaging conditions including a pulse sequence to the sequence controller 31 based on information for instructing start of a scan from the input device 33. In addition, the sequence controller control unit 41 arranges raw data received from the sequence controller 31 in k-space formed in the k-space database 42.

Therefore, when MR signals in 3D k-space are acquired according to imaging conditions for 3D HFI, k-space data of which MR data corresponding to a high frequency region of the positive or negative side in a PE direction or a SE direction does not exist is arranged in k-space formed in the k-space database 42.

The HFI processing unit 43 has a function to perform HFI processing, which is processing necessary for generating final image data in half Fourier method, based on k-space data acquired from the k-space database 42. The HFI processing includes filter processing for filling k-space data in the non-sampling region in k-space based on the k-space data in the sampling region and phase correction processing.

The phase correction processing is performed to keep the symmetry of complex conjugate which does not actually formed due to a phase distribution. The phase distribution for calculating a phase correction amount can be estimated based partial or whole k-space data in the sampling region. Especially, it is preferable to estimate the phase distribution based on symmetrically sampled k-space data in a low frequency region in view of estimating the phase distribution with high accuracy. In this case, LPF processing is performed to extract k-space data in a low frequency region from the k-space data in the sampling region prior to the phase correction.

However, errors sometimes occur in the phase correction in spite of the phase correction processing. That is, imaginary parts of complex signals sometimes do not become zero. For that reason, phase correction error can be reduced to improve accuracy in the data compensation by loop processing which repeats the data compensating processing and the phase correction processing with setting k-space data derived by a weighted addition of pieces of k-space data after and before the data compensation as the initial data.

In addition to this, phase correction error can be sometimes reduced by estimating the phase distribution using asymmetrically sampled k-space data in a high frequency region as well as k-space data in the low frequency region. In this case, filter processing for extracting k-space data in both the high frequency region and the low frequency region from the k-space data in the sampling region is performed prior to the phase correction instead of the LPF.

Further, phase correction error can sometimes reduced by performing the phase correction before compensating data in the non-sampling region. Furthermore, a HFI processing of which loop processing does not include the filter processing for compensating data, i.e., a HFI processing repeating loop processing including the phase correction and the weighted addition after the data compensation, is also known.

As described above, the HFI processing has various variations such as whether only k-space data in a low frequency region or k-space data in a high frequency region in addition to the low frequency region is used for estimating a phase distribution for the phase correction, whether the phase correction is performed as a pre-processing of data compensation processing for the non-sampling region or a post-processing of that, whether loop processing for reducing phase correction error is performed or not, whether the filter processing for the data compensation is included in the loop processing or not, and the like.

Hereinafter, a case of estimating a phase distribution using only k-space data in a low frequency region and repeating loop processing including the data compensation processing of the non-sampling region and the phase correction processing which is performed as a post-processing of the data compensation processing will be described as an example. Of course, the following processing can be applied to other methods for HFI processing similarly.

In this case, the HFI processing becomes processing which converges the imaginary parts of r-space data into zero by repeating pieces of processing including filter processing for data compensation in the non-sampling region in k-space, filter processing for extracting data in a low frequency region for estimating a phase distribution, phase correction processing of r-space data, realization processing for obtaining the real part of r-pace data after the phase correction and weighted addition processing of k-space data a predetermined times. Therefore, the HFI processing unit 43 has a function to perform various processing consisting of the HFI processing such as FT or FFT processing for transforming k-space data into r-space data, IFT or IFFT processing for transforming image data which is r-space data into k-space data and the like in addition to the above mentioned processing.

Especially, the HFI processing unit 43 is configured to estimate a phase distribution based on partial MR data out of acquired MR data (k-space data) in a 3D sampling region instead of the whole MR data to reduce a HFI processing amount and a HFI processing period more than conventional estimation. For that purpose, the HFI processing unit 43 has a first phase correction amount calculation part 43A, a second phase correction amount determining part 43B and a diagnostic image generating part 43C.

The first phase correction amount calculation part 43A has a function to extract a part of MR signals in 3D k-space acquired according to imaging conditions for 3D HFI to set the extracted MR signals less than the acquired MR signals as k-space data for calculating a first phase correction amount for phase correction and a function to calculate the first phase correction amount by a first HFI processing of the MR signals in 3D k-space. The first HFI processing is repeating processing, including filter processing for obtaining complex conjugate to compensate data in a non-sampling region using complex symmetry in k-space and phase correction based on the k-space data for calculating the first phase correction amount, of the MR signals in 3D k-space.

Figure 3:
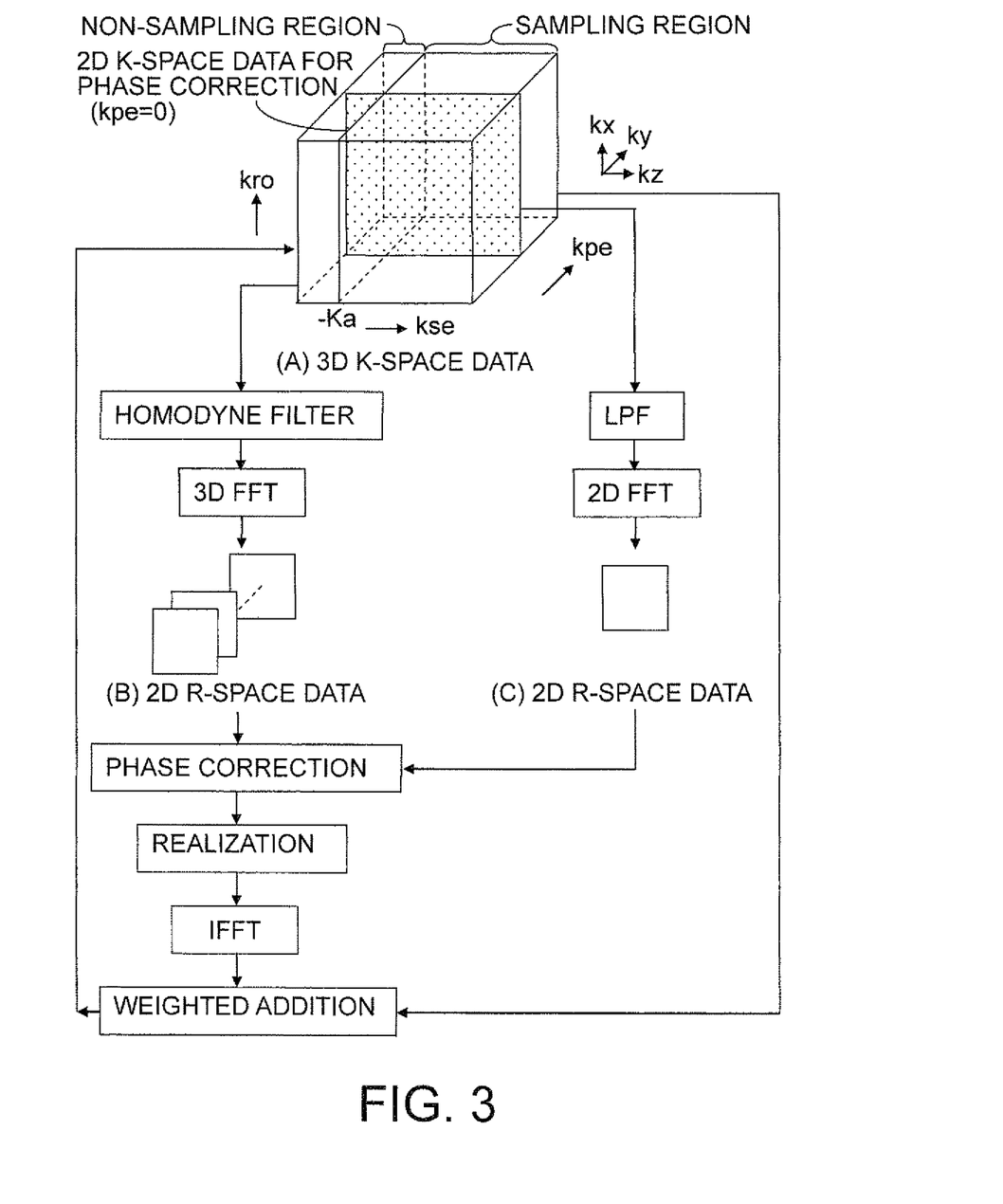
FIG. 3 is a diagram showing an example of the first HFI processing performed in the first phase correction amount calculation part shown in FIG. 2.

FIG. 3 is a diagram showing an example of the first HFI processing performed in the first phase correction amount calculation part 43A shown in FIG. 2.

As shown in FIG. 3 (A), spatial k-space data having three axis directions of the kpe, kse and kro directions in k-space respectively corresponding to the PE, SE and RO (readout) directions in r-space is acquired by a 3D data acquisition. Note that, 3D k-space data asymmetric in the PE or SE direction is acquired in HFI. FIG. 3 (A) shows an example case where a high frequency region in the negative pole side in the SE direction is set to the non-sampling region. Hence, only a low frequency region and a high frequency region in the positive pole side in the SE direction are sampling regions, and k-space data is filled in a region of kpe≥−Ka.

The PE, SE and RO directions are respectively set to arbitrary spatial coordinate axes such as the x axis, the y axis, the z axis and an oblique axis according to a diagnostic purpose. FIG. 3 (A) shows an example where the PE, SE and RO directions in r-space are set to the y, z and x axes respectively. Hence, the kpe, kse and kro directions in k-space are the ky, kz and kx directions respectively.

When a homodyne filter is applied to the 3D k-space data shown in FIG. 3 (A), k-space data equivalent to k-space data derived by compensating k-space data in the non-sampling region is generated. Note that, the homodyne filter is a filter which applies filter processing equivalent to processing for compensating complex conjugate data of the sampling region into the non-sampling region.

Figure 4:
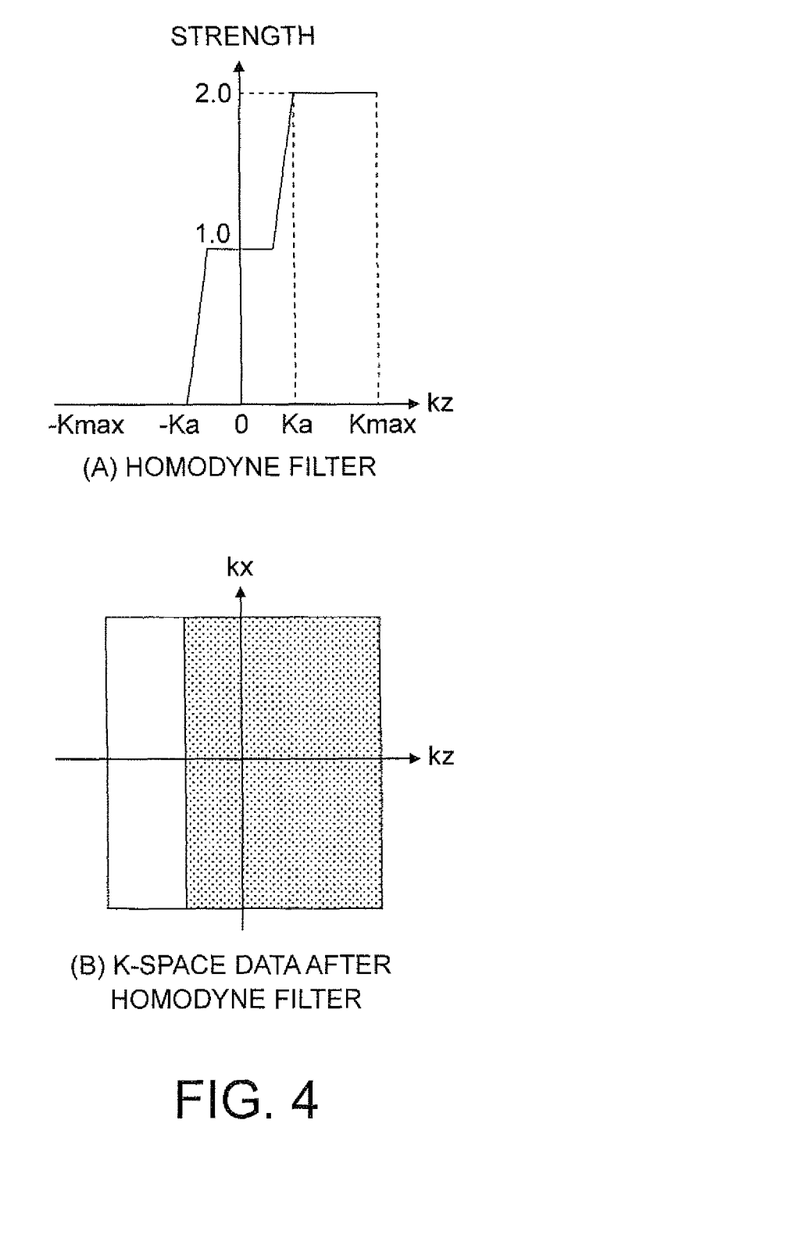
FIG. 4 is a graph showing an example of characteristic of the homodyne filter used in the HFI processing unit shown in FIG. 2.

FIG. 4 is a graph showing an example of characteristic of the homodyne filter used in the HFI processing unit 43 shown in FIG. 2.

In FIG. 4 (A), the abscissa axis denotes the kz direction and the ordinate axis denotes strength of the homodyne filter. In FIG. 4 (B), the abscissa axis denotes the kz direction and the ordinate axis denotes the kx direction.

When the 3D k-space data asymmetric in the kz direction is acquired as shown in FIG. 3, a homodyne filter having a strength distribution in the kz direction as shown in FIG. 4 (A) and constant strength in the kx and ky directions can be used for the filter processing for example. Specifically, the homodyne filter having a strength profile, that the strength is zero in a range of negative pole side high frequency region −Kmax≤kz≤−Ka in which no k-space data is acquired, 1.0 in a range of low frequency region −Ka<kz<Ka in which k-space data is acquired and 2.0 in a range of positive pole side high frequency region Ka≤kz≤Kmax in which k-space data is acquired, can be used for the filter processing.

FIG. 4 (A) shows an example of strength distribution of the homodyne filter which varies linearly between constant values. However, a homodyne filter having a curved strength distribution varying smoothly may be used for the filter processing.

When the filter processing is performed to the 3D k-space data asymmetrically acquired in the kz direction with the homodyne filter having the strength distribution as shown in FIG. 4 (A), k-space data after the homodyne filter processing is obtained as shown in FIG. 4 (B).

Then, 3D FFT of the 3D k-space data after the homodyne filter processing generates pieces of 2D r-space data as pieces of slice image data as shown in FIG. 3 (B).

On the other hand, a single frame of 2D k-space data extracted from the 3D k-space data shown in FIG. 3 (A) can be set to k-space data for calculating the first phase correction amount for the phase correction. In view of calculating the first phase correction amount with high accuracy, it is important to select at least a frame of 2D k-space data corresponding to null encode amount, which shows the highest SNR (signal to noise ratio), for calculating the phase correction amount. However, it is necessary to estimate a phase distribution of k-space data in the asymmetric direction to calculate the first phase correction amount. Therefore, 2D k-space data corresponding to null encode amount in the asymmetric direction cannot be used for calculating the first phase correction amount.

For that reason, when MR signals are acquired asymmetrically in the PE direction, it is preferable to use 2D k-space data corresponding to null encode amount in the SE direction as the k-space data for calculating the first phase correction amount. On the contrary, when MR signals are acquired asymmetrically in the SE direction, it is preferable to use 2D k-space data corresponding to null encode amount in the PE direction as the k-space data for calculating the first phase correction amount.

FIG. 3 (A) shows an example of MR signals acquired asymmetrically in the SE direction. Hence, in the example shown in FIG. 3 (A), 2D k-space data corresponding to null PE amount, i.e., kpe=0, is selected as the k-space data for calculating the first phase correction amount.

The k-space data for calculating the first phase correction amount is subjected to a LPF. Consequently, it becomes possible to extract k-space data in a low frequency region from the 2D k-space data to use the extracted 2D k-space data in the low frequency region for estimating the phase distribution.

Figure 5:
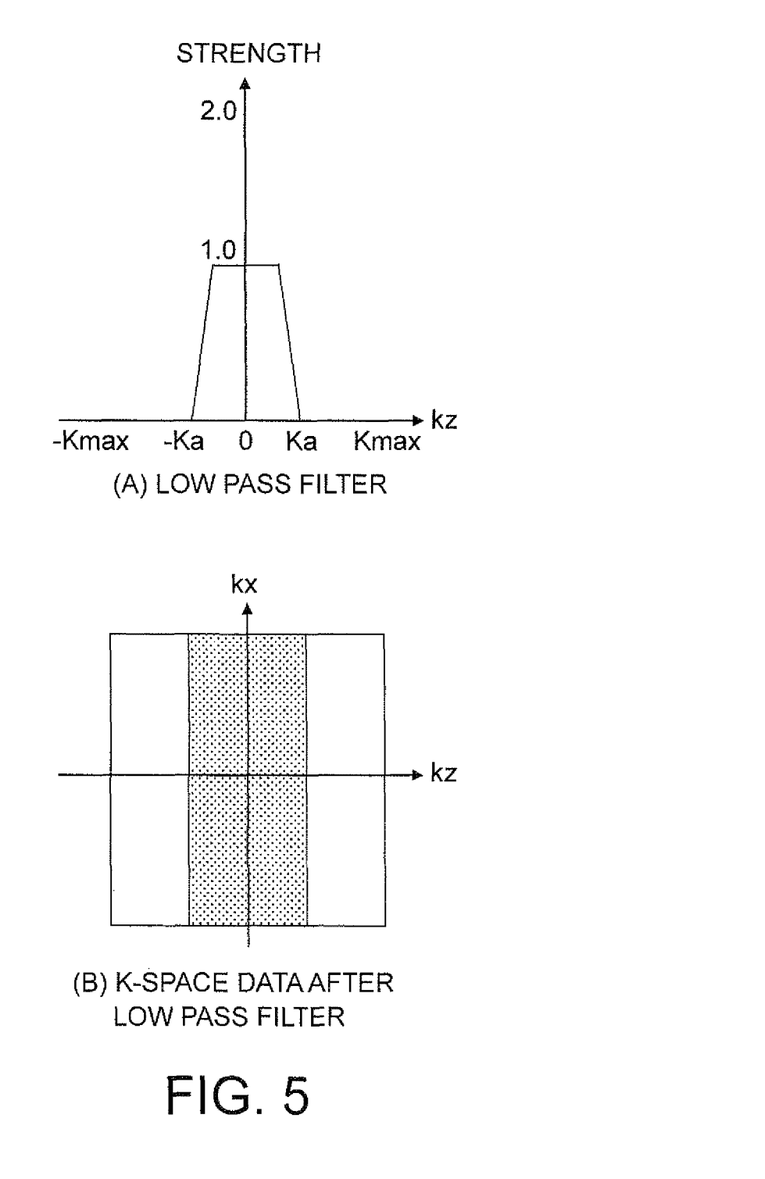
FIG. 5 is a graph showing an example of characteristic of the LPF used in the HFI processing unit shown in FIG. 2.

FIG. 5 is a graph showing an example of characteristic of the LPF used in the HFI processing unit 43 shown in FIG. 2.

In FIG. 5 (A), the abscissa axis denotes the kz direction and the ordinate axis denotes strength of the LPF. In FIG. 5 (B), the abscissa axis denotes the kz direction and the ordinate axis denotes the kx direction.

When the 3D k-space data asymmetric in the kz direction is acquired as shown in FIG. 3, a LPF having a strength distribution in the kz direction as shown in FIG. 5 (A) and constant strength in the kx and ky directions can be used for the filter processing for example. Specifically, the LPF having a strength profile, that the strength is 1.0 in a range of low frequency region −Ka<kz<Ka in which k-space data is acquired and zero in ranges of negative pole side high frequency region −Kmax≤kz≤−Ka in which no k-space data is acquired and positive pole side high frequency region Ka≤kz≤Kmax in which k-space data is acquired, can be used for the filter processing.

FIG. 5 (A) shows an example of strength distribution of the LPF which varies linearly between constant values. However, a LPF having a curved strength distribution varying smoothly may be used for the filter processing.

When the filter processing is performed to the 2D k-space data for calculating the first phase correction amount with the LPF having the strength distribution as shown in FIG. 5 (A), k-space data after the LPF processing is obtained as shown in FIG. 5 (B). That is, the 2D k-space data in the low frequency region is extracted for estimating the phase distribution.

Then, 2D FFT of the 2D k-space data for estimating the phase distribution after the LPF processing generates a single piece of 2D r-space data as a frame of slice image data as shown in FIG. 3 (C). Subsequently, the phase distribution in the low frequency region can be calculated by dividing complex conjugate data of the 2D r-space data for estimating the phase distribution by the absolute value of the 2D r-space data for estimating the phase distribution.

Next, the phase correction of the frames of 2D r-space data generated by the homodyne filter processing and 3D FFT is performed using the phase distribution calculated based on the 2D r-space data corresponding to PE=0. As a result, multi-slice image data after the data compensation in the non-sampling region and the phase correction can be obtained.

However, if the phase distribution involves errors, the imaginary part of the 2D r-space data after the phase correction does not become zero. Accordingly, the data compensation processing and the phase correction are repeated with setting k-space data derived by a weighted addition of the pieces of k-space data before and after the data compensation as the initial data. That is, loop processing for converging the imaginary part of the 2D r-space data after the phase correction to zero is performed.

More specifically, realization processing which obtains the real parts of the pieces of 2D r-space data after the phase correction by removing the imaginary parts respectively is performed to remove errors. Next, 3D k-space data in the whole frequency region after the data compensation is generated by 2D IFFT of the pieces of 2D r-space data after the realization processing. Next, the weighted addition of the pieces of 3D k-space data before and after the data compensation is performed. The 3D k-space data obtained as a result of the weighted addition is used as the initial data for the data compensation processing with the homodyne filter and extraction of the 2D k-space data corresponding to kpe=0 for calculating the first phase correction amount again.

Then, the imaginary part of the r-space data after the phase correction can be approximated to zero by repeating the above mentioned loop processing necessary times predetermined by a simulation or experimentally. In other words, it becomes possible to calculate a difference between the phase of the acquired MR data and the phase of the data after the loop processing as the first phase correction amount appropriate for the phase correction.

In the first HE processing shown in FIG. 3, not 3D k-space data but a single frame of 2D k-space data is used for estimating the phase distribution. Therefore, necessary processing for estimating the phase distribution is not conventional 3D FFT of 3D k-space data for estimating a phase distribution but 2D FFT of the 2D k-space data. Consequently, a data processing amount required to calculate the first phase correction amount can be reduced more than the conventional processing. Especially, when the number of the loop processing is many, FFT is repeated. Therefore, reduction in the data processing amount and the data processing period becomes remarkable.

In addition, in case of acquiring MR data with multi coil elements, the HFI processing is performed to pieces of 3D k-space data corresponding to multi reception channels respectively. Therefore, the data processing amount and the data processing period for estimating the phase distribution can be reduced greater.

FIG. 3 shows an example of using the single frame of 2D k-space data for estimating the phase distribution for the phase correction. However, the phase distribution may be estimated for the phase correction with multi frames of 2D k-space data. In case of using the single frame of 2D k-space data for estimating the phase distribution, a single representative value of the phase distribution of r-space data to be a target of the phase correction is to be estimated.

Meanwhile, using multi frames of 2D k-space data for estimating the phase distributions for the phase correction makes it possible to estimate multi representative values of the phase distributions of r-space data to be a target of the phase correction. Therefore, the phase correction can be performed with higher accuracy to generate final MR image data.

Figure 6:
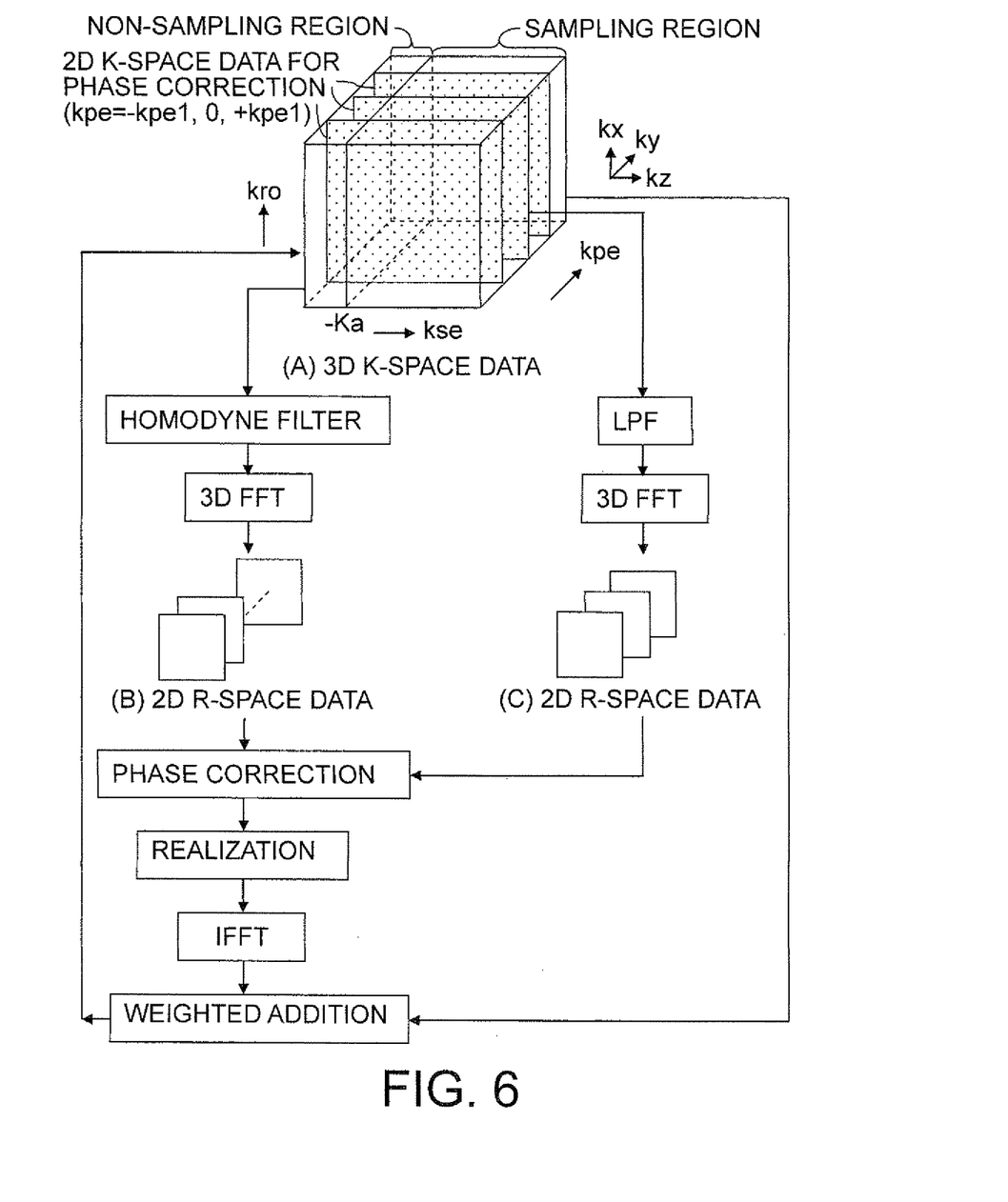
FIG. 6 is a diagram showing another example of the first HFI processing performed in the first phase correction amount calculation part shown in FIG. 2.

FIG. 6 is a diagram showing another example of the first HFI processing performed in the first phase correction amount calculation part 43A shown in FIG. 2.

The first HFI processing shown in FIG. 6 is different from that shown in FIG. 3 in the point that frames of 2D k-space data are extracted from the 3D k-space data as shown in (A) to set the extracted frames of 2D k-space data as the k-space data for calculating the first phase correction amount. Therefore, explanation for common features is omitted.

FIG. 6 shows an example of setting three frames of 2D k-space data corresponding to kpe=−kpe1, 0, kpe1 respectively as the k-space data for calculating the first phase correction amount. In this case, the three pieces of 2D k-space data in the low frequency region are extracted by LPF. Then, three frames of 2D r-space data as shown in (C) are generated for estimating the phase distribution by 3D FFT of the three pieces of 2D k-space data in the low frequency region.

Therefore, three estimation values of phase distributions corresponding to mutually different positions in the kpe direction can be calculated based on the three frames of 2D r-space data. This calculation means separating 3D k-space shown in (A) in the kpe direction into three segments and estimating phase distributions for the respective separated segments. Therefore, each piece of 2D r-space data to be a target of the phase correction is subjected to the phase correction with the phase distribution estimated based on 2D r-space data for estimating the phase distribution corresponding to the same separated segment, i.e., the closest 2D r-space data for estimating the phase distribution.

As described above, selecting pieces of 2D k-space data corresponding to mutually different encode amounts in the encode direction in which the acquired MR data is symmetric as the pieces of k-space data for calculating the first phase correction amounts makes it possible to estimate the phase distributions with higher accuracy to perform the phase correction. That is, by using pieces of 2D k-space data including at least the piece of 2D k-space data corresponding to nonzero encode amount as the pieces of k-space data for calculating the first phase correction amount, first phase correction amounts corresponding to mutually different encode amounts can be calculated.

On the other hand, the data processing amount and the data processing period of 3D FFT for calculating the phase distributions can be reduced by setting k-space data less than the acquired MR data to the k-space data for calculating the first phase correction amounts. Therefore, accuracy in the phase correction and the data processing amount having mutually trade-off relationship can be optimized by adjusting the number of pieces and positions of the 2D k-space data for calculating the first phase correction amounts.

The second phase correction amount determining part 43B has a function to determine a second phase correction amount for 3D phase correction performed to the MR signals in 3D k-space acquired according to the imaging conditions for 3D HFI based on the first phase correction amount or the first phase correction amounts.

When the first phase correction amount is calculated as a single value and the second phase correction amount is set to be constant in the encode direction in which the acquired MR data is symmetric for example, the first phase correction amount can be set to the second phase correction amount without change.

When the first phase correction amounts are respectively calculated for different encode amounts in the encode direction in which the acquired MR data is symmetric, the first phase correction amounts can be also set to the second phase correction amounts corresponding to the respective encode amounts without change. In case of the example shown in FIG. 6, the first phase correction amounts corresponding to the positions in the kpe direction can be directly determined to the second phase correction amounts corresponding to the positions in the kpe direction.

Meanwhile, when the second phase correction amounts are respectively set so as to correspond to the encode amounts in the encode direction in which the acquired MR data is symmetric, the second phase correction amounts according to the encode amounts can be obtained based on the single first phase correction amount or the first phase correction amounts calculated in the first phase correction amount calculation part 43A.

For example, if it is considered that the second phase correction amount varies linearly in proportion to the encode amount in the encode direction in which the acquired MR data is symmetric, the second phase correction amounts corresponding to arbitrary encode amounts can be calculated by changing one first phase correction amount linearly, interpolation between first phase correction amounts or fitting based on first phase correction amounts. In the example shown in FIG. 3 or 6, the second phase correction amounts corresponding to mutually different positions in the kpe direction can be calculated. Note that, coefficients for calculating the second phase correction amounts can be predetermined by a simulation or experimentally.

The diagnostic image generating part 43C has a function to perform second HFI processing, including filter processing for compensating data in the non-sampling region by obtaining 3D complex conjugate, phase correction with the second phase correction amounts based on the first phase correction amounts and image reconstruction processing, to the MR signals in 3D k-space acquired under the imaging conditions for 3D HFI to generate diagnostic MR image data. That is, the phase correction amounts are already determined in the second HFI processing. Therefore, extraction of k-space data for estimating a phase distribution and estimation of a phase distribution are not performed. Further, the loop processing for reducing phase correction errors is not always required.

The image processing unit 44 has a function to perform necessary processing, such as distortion correction processing, of MR image data, after the HFI processing, obtained from the HFI processing unit 43 and display the MR image data on the display unit 34.

Then, the operation of the magnetic resonance imaging apparatus 20 will be described.

Figure 7:
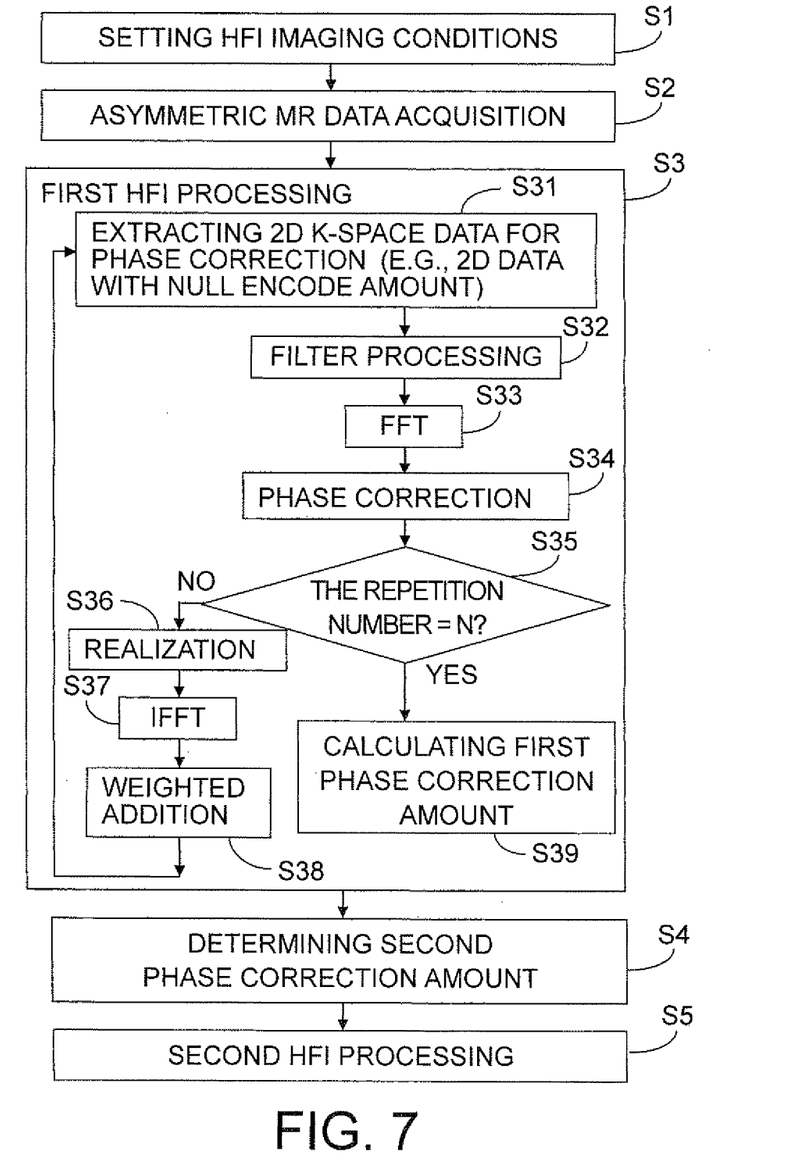
FIG. 7 shows a flowchart indicating a flow for acquiring image data of the object P by HFI with the magnetic resonance imaging apparatus shown in FIG. 1.

FIG. 7 shows a flowchart indicating a flow for acquiring image data of the object P by HFI with the magnetic resonance imaging apparatus 20 shown in FIG. 1.

In the step S1, the imaging condition setting unit 40 sets imaging conditions for HFI. Specifically, imaging conditions for acquiring 3D MR data asymmetric in the SE or PE direction by a pulse sequence such as a FASE sequence are set.

In the step S2, MR data is acquired according to the imaging conditions set by the imaging condition setting unit 40. Specifically, the object P is set to the bed 37, and a static magnetic field is generated at an imaging area of the magnet 21 (a superconducting magnet) for static magnetic field excited by the static-magnetic-field power supply 26.

Further, the shim-coil power supply 28 supplies current to the shim coil 22, thereby uniformizing the static magnetic field generated at the imaging area. Then, the input device 33 sends instruction of starting a scan to the sequence controller control unit 41. The sequence controller control unit 41 supplies the imaging conditions including the pulse sequence received from the imaging condition setting unit 40 to the sequence controller 31. Therefore, the sequence controller 31 drives the gradient power supply 27, the transmitter 29, and the receiver 30 in accordance with the pulse sequence received from the sequence controller control unit 41, thereby generating a gradient magnetic field at the imaging area having the set object P, and further generating RF signals from the RF coil 24.

Consequently, the RF coil 24 receives MR signals generated due to nuclear magnetic resonance in the object P. Then, the receiver 30 receives the MR signals from the RF coil 24 and generates 3D raw data which is digital data of MR signals by A/D conversion subsequently to necessary signal processing.

Here, the sequence controller control unit 41 controls data acquisition so that partial MR data in 3D k-space does not acquired according to the conditions for data acquisition in HFI. The data which has not been acquired in k-space is compensated by the HFI processing to be hereinafter described.

The receiver 30 supplies the generated raw data to the sequence controller 31. The sequence controller 31 supplies the raw data to the sequence controller control unit 41. The sequence controller control unit 41 arranges the raw data as 3D k-space data in k-space formed in the k-space database 42.

In the step S3, the HFI processing unit 43 calculates at least one first phase correction amount through the first HFI processing.

More specifically, in the step S31, the first phase correction amount calculation part 43A extract a single piece or multi pieces of 2D k-space data for calculating at least one first phase correction amount out of the 3D k-space data arranged in the k-space database 42.

It is important to select the 2D k-space data corresponding to zero encode amount in the direction in which the k-space data is symmetric for calculating the phase correction amounts in view of obtaining the first phase correction amounts with high accuracy. Accordingly, an example case where the ky direction is set to the PE direction and k-space data asymmetric in the kz direction set to the SE direction is sampled as shown in FIG. 3 will be described here.

In this case, at least the piece of 2D k-space data corresponding to zero encode amount in the PE direction, i.e., kpe=ky=0, is set for calculating the first phase correction amount.

Next, in the step S32, the first phase correction amount calculation part 43A performs the homodyne filter processing shown by equation (5-1) and the LPF processing shown by equation (5-2).

$$K(kx,kz)fh \rightarrow Kh(kx,kz) \quad (5\text{-}1)$$

$$K0(kx,kz)fl \rightarrow Kl(kx,kz) \quad (5\text{-}2)$$

Specifically, each of frames of 2D k-space data K(kx, kz) consisting of the asymmetric 3D k-space data and parallel to the Kx-Ky plane is multiplied by the homodyne filter fh as shown by equation (5-1). Herewith, frames of 2D k-space data Kh(kx, kz) of which non-sampling regions are compensated with data are generated.

On the other hand, a single frame or each of multi frames of 2D k-space data K0(kx, kz) for calculating at least one first phase correction amount is multiplied by the LPF fl as shown by equation (5-2). Herewith, at least one frame of 2D k-space data Kl(kx, kz) in the low frequency region is generated for estimating the phase distribution.

Next, in the step S33, the first phase correction amount calculation part 43A applies FFT processing to the respective pieces of 2D k-space data Kh(kx, kz), Kl(kx, kz) after the respective filter processing as shown by equations (6-1) and (6-2). Herewith, pieces of 2D r-space data Vh(x, z), Vl(x, z) are obtained.

$$FFT\{Kh(kx,kz)\} \rightarrow Vh(x,z) \quad (6\text{-}1)$$

$$FFT\{Kl(kx,kz)\} \rightarrow Vl(x,z) \quad (6\text{-}2)$$

That is, the frames of 2D r-space data Vh(x, z) to be subjected to the phase correction and the single frame or frames of 2D r-space data Vl(x, z) for estimating at least one phase distribution for the phase correction are reconstructed.

Next, in the step S34, the first phase correction amount calculation part 43A performs the phase correction of the respective frames of 2D r-space data Vh(x, z) with at least one phase distribution calculated based on the 2D r-space data Vl(x, z) calculated by equation (6-2).

Next, in the step S35, the first phase correction amount calculation part 43A determines whether the repetition number of the processing from the step S31 to the step S34 reaches a predetermined threshold N of the number. The threshold N is set about 2 to 4 experimentally. This repetition number N of the processing may be able to be set to a variable value as a data processing condition with operation of the input device 33.

When the repetition number of the loop processing is not determined to reach the threshold N, the first phase correction amount calculation part 43A performs realization processing which obtains the real parts of the respective pieces of 2D r-space data after the phase correction in the step S36. As a result, pieces of 2D r-space data Vcor(x, z) each having only the real signal after the data compensation and the phase correction are obtained.

The processing in the step S34 and the step S36 is indicated by equation (7).

$$Vcor(x,z) = REAL\{Vh(x,z)*Vl^*(x,z)/|Vl(x,z)|\} \quad (7)$$

wherein REAL( ) is processing for obtaining the real part and Vl* denotes the complex conjugate of Vl.

Further, in order to improve accuracy in the phase correction and the data compensation processing in k-space, a weighted addition of the 2D k-space data, after the data compensation and the phase correction, generated by the above mentioned processing and the 2D k-space data before the data compensation and the phase correction is performed. Then, the filter processing of the 2D k-space data, the FFT processing of the k-space data after the filter processing, the phase correction and the weighted addition, as mentioned above, are repeatedly performed with using the 2D k-space data obtained by the weighted addition as the initial data.

For that purpose, in the step S37, first phase correction amount calculation part 43A transforms the 2D r-space data Vcor(x, z) having only the real signals after the data compensation and the phase correction to 2D k-space data Kcor(kx, kz) by IFFT as shown by equation (8).

$$Kcor(kx,kz) = IFFT\{Vcor(x,z)\} \quad (8)$$

Next, in the step S38, the first phase correction amount calculation part 43A performs the weighted addition of the respective pieces of 2D k-space data Kcor(kx, kz) after the data compensation and the phase correction and the corresponding pieces of 2D k-space data K(kx, kz) before the data compensation and the phase correction. The result of the weighted addition is used as the initial data for the filter processing in the step S32 again as shown by equation (9).

$$K(kx,kz) = \alpha Kcor(kx,kz) + (1-\alpha)K(kx,kz) \quad (9)$$

wherein α is a weight coefficient having a value so as to be 0<α<1. The weight coefficient can be determined to an appropriate value by a simulation or experimentally. Typically, the weight coefficient α is a value depending on a position kz in which the k-space is asymmetric. Concretely, the weight coefficient α(kz) is set so that the ratio of the 2D k-space data Kcor(kx, kz) after the data compensation and the phase correction becomes large in the non-sampling region while the ratio of the 2D k-space data K(kx, kz) before the data compensation and the phase correction becomes large in the sampling region.

The weight coefficient α for the weighted addition may be able to set to a variable value as a data processing condition with operation of the input device 33.

When the repetition number of the loop processing from the step S31 to the step S38 reaches the threshold N, the determination in the step S35 results in YES. Herewith, the loop processing 1s completed.

After the loop processing has finished, the first phase correction amount calculation part 43A calculates at least one first phase correction amount based on the result of the loop processing in the step S39. The first phase correction amount can be calculated as the exponential function β1(z) of the difference φ(z) in phase between the r-space data obtained by transforming the 2D k-space data K(kx, kz), which was the original data for the first HFI processing, before the phase correction and the 2D r-space data Vhfi(x, z) after the loop processing including the phase correction as shown by equation (10).

$$\beta 1(z) = \exp\{-i\varphi(z)\} \quad (10)$$
$$= \text{conjugate}[FFT\{K(Kx, Kz)\}]/|FFT\{K(Kx, Kz)\}| *$$
$$|Vhfi(x, z)|/Vhfi^*(x, z)$$

wherein conjugated( ) is the function to obtain the complex conjugate and Vhfi* denotes the complex conjugate of Vhfi.

Next, in the step S4, the second phase correction amount determining part 43B determines at least one second phase correction amount β2 based on the one or plural first phase correction amounts β1(z). When the second phase correction amount β2 is set to be constant in the y axis direction which is the PE direction, the first phase correction amount β1(z) can be set to the second phase correction amount β2(z) for 3D phase correction as shown by equation (11).

$$\beta 2(z) = \beta 1(z) \quad (11)$$

On the contrary, when the second phase correction amount β2 is varied according to the PE amount, a value obtained by multiplying one first phase correction amounts β1(z) by a coefficient γ(y) depending on a position y in the y axis direction can be set to the second phase correction amount β2(y, z) as shown by equation (12). When the second phase correction amount β2(y, z) is varied linearly in the y axis direction, the coefficient γ(y) is a value proportion to the position y.

$$\beta 2(y,z) = \beta 1(z)\gamma(y) \quad (12)$$

On the other hand, when pieces of 2D k-space data K0(kx, kyi, kz) corresponding to positions ky=kyi (i is a natural number) has been set for calculating the first phase correction amounts β1, the number i of the pieces of 2D k-space data K0(kx, kyi, kz) for calculating the first phase correction amounts β1 becomes the number of the first phase correction amounts β1(yi, z). In this case, the first phase correction amounts β1(yi, z) can be set to the second phase correction amounts β2(y, z) corresponding to the positions y without change. Alternatively, the second phase correction amounts β2(y, z) corresponding to the positions y can be determined by interpolation or extrapolation based on the first phase correction amounts β1(yi, z).

Next, in the step S5, the diagnostic image generating part 43C performs the second HFI processing, including filter processing for data compensation with the homodyne filter fh and phase correction with the second phase correction amount(s) β2, to the acquired MR signals in 3D k-space.

Specifically, the homodyne filter processing fh is applied to the asymmetric 3D k-space data K(kx, ky, kz) acquired in the step S2 for data compensation. Subsequently, 3D FFT is applied to the 3D k-space data after the homodyne filter processing as image reconstruction processing as shown by equation (13). Herewith, 3D r-space data V(x, y, z) is reconstructed as 3D MR image data.

$$V(x,y,z)FFT\{K(kx,ky,kz)fh\} \quad (13)$$

Next, the phase correction of the 3D r-space data V(x, y, z) with the second phase correction amount(s) β2 and realization processing of the 3D r-space data after the phase correction are performed as shown by equation (14). Herewith, the final MR image data Vfinal(x, y, z) is generated for diagnosis.

$$Vfinal(x,y,z)=gREAL\{V(x,y,z)\beta2\} \quad (14)$$

Note that, g denotes an arbitrary coefficient for adjusting the amplitude of image signal and is set to g=2.0 for example. The coefficient g corresponds to a gain and can be determined experimentally or by a simulation.

After that, the image processing unit 44 performs necessary image processing, such as distortion correction processing, of the diagnostic MR image data Vfinal obtained from the HFI processing unit 43 and displays the diagnostic MR image data Vfinal on the display unit 34. Herewith, a user becomes possible to observe the diagnostic MR image displayed on the display unit 34 for diagnosis.

As described above, the magnetic resonance imaging apparatus 20 can reduce the processing amount for FFT required to estimate a phase distribution for phase correction in HFI processing more than the conventional technique. Especially, using a single frame of 2D k-space data for estimating a phase distribution makes it possible to calculate a phase correction amount by 2D FFT. Consequently, the total data processing amount and data processing period can be reduced. Alternatively, the number of repetition of the loop processing can be increased to improve accuracy with keeping the total data processing amount and data processing period to the equivalent degree.

Note that, the phase correction may be performed to k-space data instead of r-space data. When the phase correction is performed to k-space data, processing becomes easily. On the contrary, performing the phase correction to r-space data leads to improve accuracy.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a data acquisition unit configured to acquire magnetic resonance signals in three dimensional k-space according to an imaging condition for half Fourier imaging;
a phase correction amount calculation unit configured to calculate a first phase correction amount by applying processing including a phase correction based on k-space data for calculating the first phase correction amount and data compensation for a non-sampling region using complex conjugate symmetry in k-space with the magnetic resonance signals in the three dimensional k-space, the k-space data for calculating the first phase correction being magnetic resonance signals less than the magnetic resonance signals in the three dimensional k-space; and
an image data generating unit configured to generate magnetic resonance image data by applying processing including a phase correction using a second phase correction amount based on the first phase correction amount, the data compensation and image reconstruction processing with the magnetic resonance signals in the three dimensional k-space.

2. A magnetic resonance imaging apparatus of claim 1, wherein said phase correction amount calculation unit is configured to calculate first phase correction amounts by using pieces of two dimensional k-space data including two dimensional k-space data corresponding to a non-zero encode amount as the k-space data for calculating the first phase correction amount.

3. A magnetic resonance imaging apparatus of claim 1, wherein said data acquisition unit is configured to acquire magnetic resonance signals asymmetric in a phase encode direction while said phase correction amount calculation unit configured to use two dimensional k-space data corresponding to a null encode amount in a slice encode direction as the k-space data for calculating the first phase correction amount.

4. A magnetic resonance imaging apparatus of claim 1, wherein said data acquisition unit is configured to acquire magnetic resonance signals asymmetric in a slice encode direction while said phase correction amount calculation unit configured to use two dimensional k-space data corresponding to a null encode amount in a phase encode direction as the k-space data for calculating the first phase correction amount.

5. A magnetic resonance imaging apparatus of claim 1, wherein said image data generating unit configured to use the first phase correction amount as the second phase correction amount.

6. A magnetic resonance imaging apparatus of claim 1, wherein said image data generating unit configured to obtain second phase correction amounts corresponding to encode amounts base on the first phase correction amount.

7. A magnetic resonance imaging method comprising:
acquiring magnetic resonance signals in three dimensional k-space according to an imaging condition for half Fourier imaging;
calculating a first phase correction amount by applying processing including a phase correction based on k-space data for calculating the first phase correction amount and data compensation for a non-sampling region using complex conjugate symmetry in k-space with the magnetic resonance signals in the three dimensional k-space, the k-space data for calculating the first phase correction being magnetic resonance signals less than the magnetic resonance signals in the three dimensional k-space; and generating magnetic resonance image data by applying processing including a phase correction using a second phase correction amount based on the first phase correction amount, the data compensation and image reconstruction processing with the magnetic resonance signals in the three dimensional k-space.

* * * * *